US011131691B2

(12) United States Patent
Sakaguchi et al.

(10) Patent No.: US 11,131,691 B2
(45) Date of Patent: Sep. 28, 2021

(54) PROBE HOLDER AND PROBE UNIT

(71) Applicant: NHK Spring Co., Ltd., Yokohama (JP)

(72) Inventors: Tsukasa Sakaguchi, Kanagawa (JP); Kazuya Souma, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 43 days.

(21) Appl. No.: 16/498,480

(22) PCT Filed: Mar. 26, 2018

(86) PCT No.: PCT/JP2018/012211
§ 371 (c)(1),
(2) Date: Sep. 27, 2019

(87) PCT Pub. No.: WO2018/181216
PCT Pub. Date: Oct. 4, 2018

(65) Prior Publication Data
US 2020/0033380 A1 Jan. 30, 2020

(30) Foreign Application Priority Data
Mar. 30, 2017 (JP) .............................. JP2017-069271

(51) Int. Cl.
G01R 1/073 (2006.01)
(52) U.S. Cl.
CPC ................ G01R 1/07307 (2013.01)
(58) Field of Classification Search
CPC .................................................. G01R 1/07307
See application file for complete search history.

(56) References Cited

U.S. PATENT DOCUMENTS 6,556,033 B1   4/2003   Kazama
8,149,008 B2 * 4/2012   Yamada ............. G01R 1/07371
                                                       324/754.01
(Continued)

FOREIGN PATENT DOCUMENTS

CN   1308727 A   8/2001
CN   1518667 A   8/2004
(Continued)

OTHER PUBLICATIONS

English translation of CN 10110997768 A (Year: 2008).*
(Continued)

Primary Examiner — Paresh Patel
(74) Attorney, Agent, or Firm — Locke Lord LLP

(57) ABSTRACT

A probe holder holds contact probes each of which comes in contact with one electrode of a contact target on one end portion side in a longitudinal direction. The probe holder includes a plate in which holder holes configured to hold the respective contact probes are formed and penetrate the probe holder. Each of the holder holes includes a first hole portion disposed on one end of a penetrating direction and extending in the penetrating direction, a large diameter portion connected to the first hole portion and extending in the penetrating direction, the large diameter portion being larger than a diameter of the first hole portion, and a second hole portion disposed on another end of the penetrating direction, connected to the large diameter portion, and extending in the penetrating direction, the second hole portion being smaller than a diameter of the large diameter portion.

8 Claims, 4 Drawing Sheets

(56) References Cited

U.S. PATENT DOCUMENTS

| | | | |
|---|---|---|---|
| 10,082,525 B2 * | 9/2018 | Yamada | G01R 1/07378 |
| 2007/0103386 A1 | 5/2007 | Hara et al. | |
| 2008/0204061 A1 | 8/2008 | Chartarifsky et al. | |
| 2011/0025358 A1 | 2/2011 | Kazama et al. | |
| 2017/0299631 A1 | 10/2017 | Yamada et al. | |

FOREIGN PATENT DOCUMENTS

| | | | |
|---|---|---|---|
| CN | 101932941 A | | 12/2010 |
| JP | H03-200075 A | | 9/1991 |
| JP | H05-183024 A | | 7/1993 |
| JP | 2001-21615 A | | 1/2001 |
| JP | 2001-174509 A | | 6/2001 |
| JP | 2002-14113 A | | 1/2002 |
| JP | 2005217201 A | * | 8/2005 |
| JP | 2006-23243 A | | 1/2006 |
| JP | 6183024 B2 | | 4/2013 |
| JP | 2016-075709 A | | 5/2016 |
| KR | 10-2009-0126572 A | | 12/2009 |
| WO | 2016/043327 A1 | | 3/2016 |

OTHER PUBLICATIONS

International Search Report dated May 1, 2018, issued for PCT/JP2018/012211.
Notification of Reasons for Refusal dated May 16, 2019, issued in the corresponding Taiwan Application No. 107110981 and English translation thereof.
Office Action dated Jun. 2, 2021, issued In the corresponding Chinese patent application No. 201880021387.5 and English translation thereof.

* cited by examiner

PROBE HOLDER AND PROBE UNIT

FIELD

The present invention relates to a probe holder and a probe unit.

BACKGROUND

Conventionally, when performing a conductivity test or an operating characteristic test for a test target such as a semiconductor integrated circuit, a liquid crystal panel, and so on, in order to establish an electric connection between a test target and a signal processing device that outputs a test signal, a probe unit equipped with a plurality of contact probes and a probe holder that accommodates the contact probes is used (for example, refer to Patent Literature 1). The conventional probe holder as disclosed in Patent Literature 1 is formed by laminating two plates. In each of the plates, a hole capable of accommodating a part of a contact probe is formed. By making the respective holes of the plates communicate with each other, a holder hole to accommodate a contact probe is formed. This holder hole has a stepped shape in which a diameter at each of both ends is narrowed. In the probe unit, a contact probe is locked at a step portion of the holder hole, whereby the contact probe is prevented from slipping and dropping from the holder hole.

By the way, when a probe unit is assembled, or when contact probes are exchanged in order to maintain and stabilize a probe electrical property, it is necessary to arrange and dispose contact probes in a probe holder. In a probe unit disclosed by Patent Literature 1, for example, at the time of exchanging contact probes, after having disposed a contact probe in a hole of one of plates, the other plate is covered on the one of plates while putting the contact probe into a hole of the other plate, whereby the probe unit is assembled.

CITATION LIST

Patent Literature

Patent Literature 1: Japanese Patent Application Laid-open No. 2016-075709

SUMMARY

Technical Problem

However, with the configuration formed of two plates as mentioned above, in a state where a contact probe has been disposed in a hole of one of plates, there has been a need to laminate the other plate on the one of plates while confirming whether the predetermined contact probe is accommodated in a hole of the other plate. At this time, there has been a case where it is difficult to laminate the other plate so as not to sandwich the contact probe between the plates.

The present invention has been made in view of the above, and an object is to provide a probe holder and a probe unit that can arrange and dispose a contact probe at a predetermined position of a probe holder certainly and easily.

Solution to Problem

To solve the above-described problem and achieve the object, a probe holder according to the present invention holds contact probes each of which comes in contact with one electrode of a contact target on one end portion side in a longitudinal direction, and includes a plate in which holder holes configured to hold the respective contact probes are formed and penetrate the probe holder, wherein each of the holder holes includes a first hole portion disposed on one end of a penetrating direction and extending in the penetrating direction, a large diameter portion connected to the first hole portion and extending in the penetrating direction, the large diameter portion being larger than a diameter of the first hole portion, and a second hole portion disposed on another end of the penetrating direction, connected to the large diameter portion, and extending in the penetrating direction, the second hole portion being smaller than a diameter of the large diameter portion.

Moreover, in the above-described probe holder according to the present invention, $D_1=D_3$ and $0.50 \leq D_1/D_2 \leq 0.95$ are satisfied where $D_1$ is a diameter of the first hole portion, $D_2$ is a diameter of the large diameter portion, and $D_3$ is a diameter of the second hole portion.

Moreover, in the above-described probe holder according to the present invention, $D_1/D_3<1$, $0.50 \leq D_1/D_2 \leq 0.95$, and $0.5 \leq D_3/D_2 \leq 0.95$ are satisfied where $D_1$ is a diameter of the first hole portion, $D_2$ is a diameter of the large diameter portion, and $D_3$ is a diameter of the second hole portion.

Moreover, in the above-described probe holder according to the present invention, the probe holder is made of an insulating material having a bending elastic modulus of 0.5 GPa or more and 20 GPa or less.

Moreover, a probe unit according to the present invention includes: contact probes each of which comes in contact with one electrode of a contact target on one end portion side in a longitudinal direction; and a probe holder including a plate in which holder holes configured to hold the respective contact probes are formed, wherein each of the holder holes includes a first hole portion disposed on one end of a penetrating direction and extending in the penetrating direction, a large diameter portion connected to the first hole portion and extending in the penetrating direction, the large diameter portion being larger than a diameter of the first hole portion, and a second hole portion connected to the large diameter portion and extending in the penetrating direction, the second hole portion being smaller than a diameter of the large diameter portion.

Moreover, in the above-described probe unit according to the present invention, each of the contact probe includes: a first plunger including a first flange portion; a second plunger including a second flange portion; and a spring member configured to connect with the first plunger at one end and connect with the second plunger at another end.

Moreover, in the above-described probe unit according to the present invention, a relation of $-20 \leq D_3-D_{12} \leq 10$ (µm) is satisfied where $D_3$ is a diameter of the second hole portion and $D_{12}$ is a diameter of the second flange portion.

Moreover, in the above-described probe unit according to the present invention, a diameter of the first hole portion and a diameter of the second hole portion are the same, and a diameter of the first flange portion and a diameter of the second flange portion are the same.

Moreover, in the above-described probe unit according to the present invention, a diameter of the first hole portion is smaller than a diameter of the second hole portion and a diameter of the first flange portion is smaller than a diameter of the second flange portion.

Advantageous Effects of Invention

According to the present invention, the effect of arranging and disposing a contact probe at a predetermined position of a probe holder certainly and easily is attained.

DESCRIPTION OF EMBODIMENTS

Hereinafter, a mode for carrying out the present invention is described in detail with the accompanying drawings. In this connection, the present invention is not limited by embodiments described in the below. Moreover, in each drawing referred in the following description, shapes, sizes, and positional relations are merely schematically illustrated to no more than such an extent that the contents of the present invention can be understood. Therefore, the present invention is not limited only to the shapes, the sizes, and the positional relations exemplified in each drawing.

Figure 1:
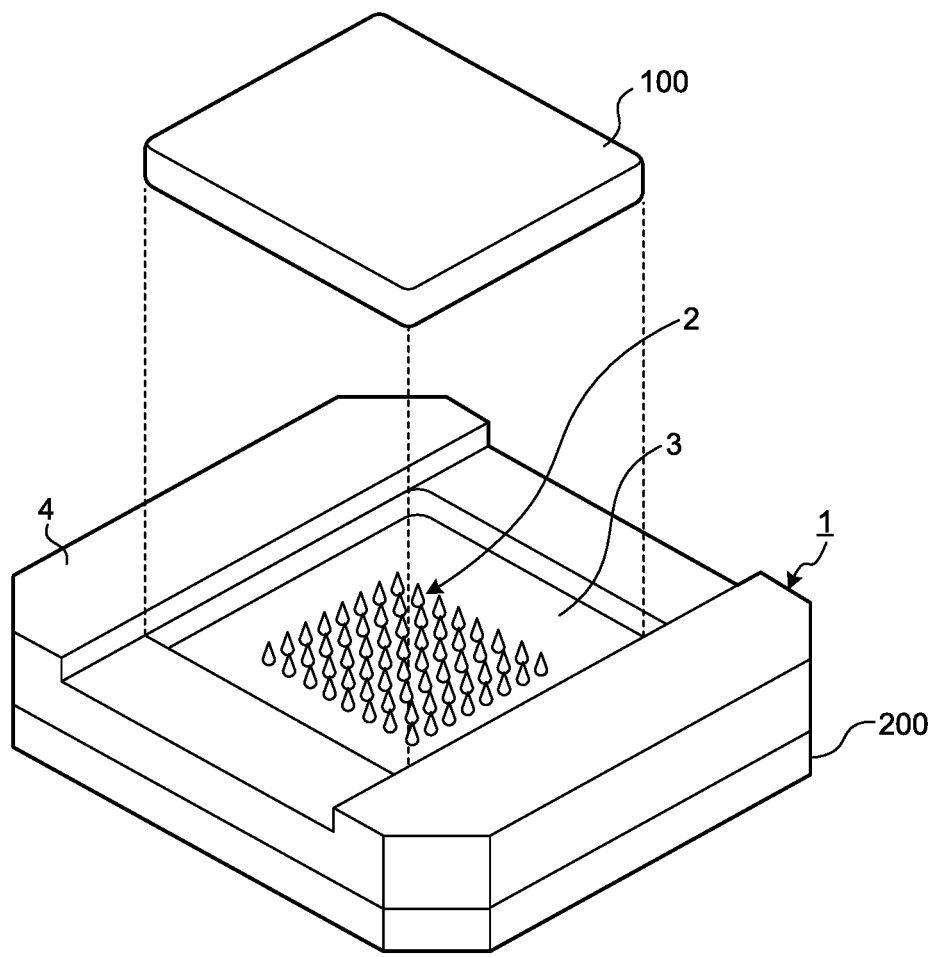
FIG. 1 is a perspective view illustrating a configuration of a probe unit according to one embodiment of the present invention.

FIG. 1 is a perspective view illustrating a configuration of a probe unit according to one embodiment of the present invention. A probe unit 1 illustrated in FIG. 1 is a device used at the time of an electrical characteristic test of a semiconductor integrated circuit 100 being a test object and a device that electrically connects between the semiconductor integrated circuit 100 and a circuit board 200 that outputs a test signal to the semiconductor integrated circuit 100.

The probe unit 1 includes a conductive contact probe 2 (hereinafter, simply referred to as a "probe 2") that comes, at its both longitudinal ends, in contact with the semiconductor integrated circuit 100 and the circuit board 200 being two mutually different contact objects, a probe holder 3 that accommodates and holds a plurality of probes 2 in accordance with a predetermined pattern, and a holder member 4 that is disposed in the circumference of the probe holder 3 and suppresses a positional shift of the semiconductor integrated circuit 100 coming in contact with the probes 2 at the time of test.

Figure 2:
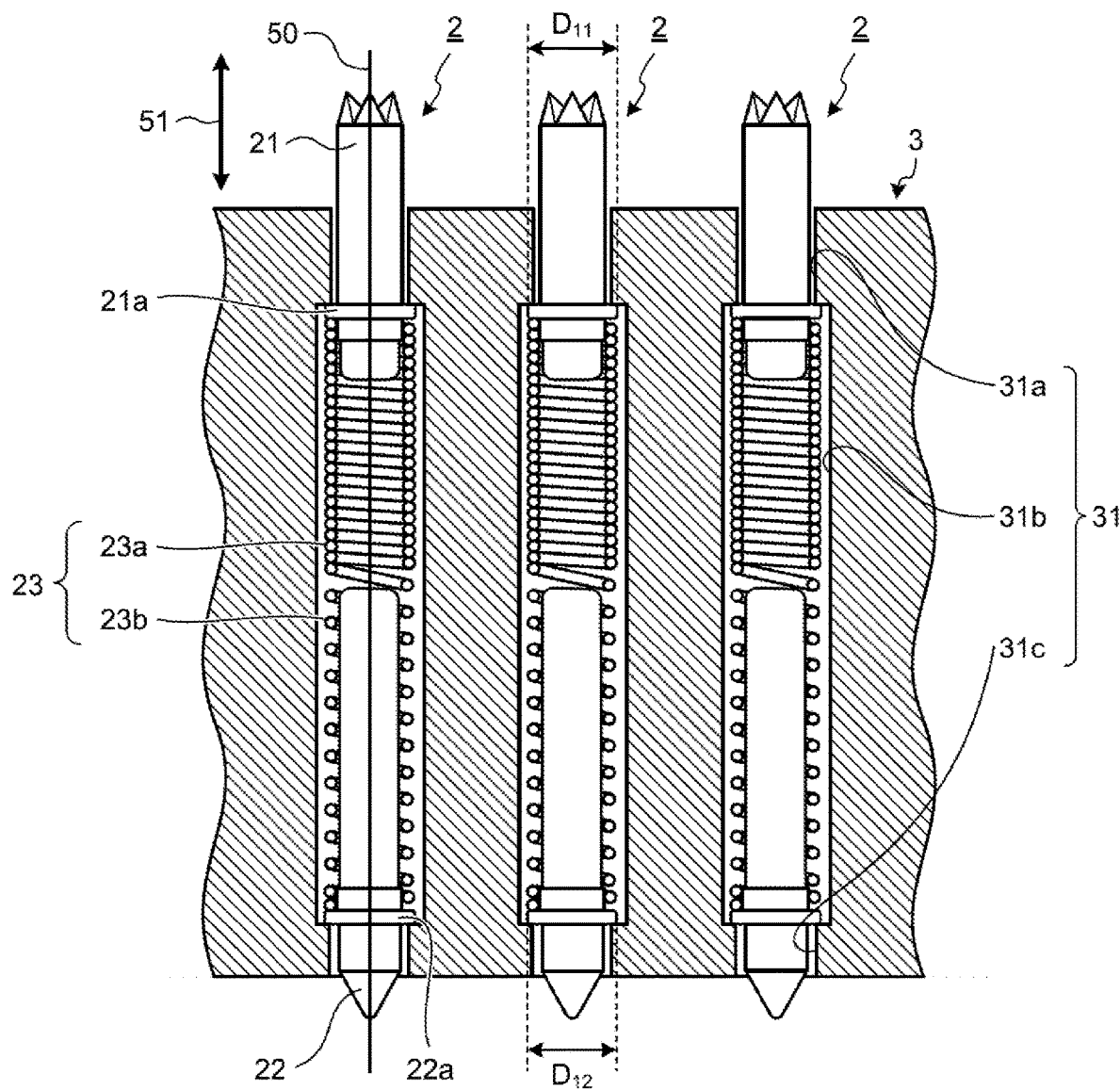
FIG. 2 is a partial sectional view illustrating a configuration of a main part of the probe unit according to the embodiment of the present invention.

FIG. 2 is a drawing illustrating a detailed configuration of the probe 2 accommodated in the probe holder 3. The probe 2 illustrated in FIG. 2 includes a first plunger 21 that is formed using a conductive material and comes in contact with a connection electrode of the semiconductor integrated circuit 100 at the time of performing the test for the semiconductor integrated circuit 100, a second plunger 22 that comes in contact with an electrode of the circuit board 200 equipped with a test circuit, and a spring member 23 that is disposed between the first plunger 21 and the second plunger 22 and extendably connects the first plunger 21 and the second plunger 22. The first plunger 21, the second plunger 22, and the spring member 23 that constitute the probe 2, have the same axis line 50. When the probe 2 is made to come in contact with the semiconductor integrated circuit 100, shock to the connection electrode of the semiconductor integrated circuit 100 is relieved by the expanding and contracting, in an axial direction 51, of the spring member 23, and in addition, load is added to the semiconductor integrated circuit 100 and the circuit board 200.

The first plunger 21 includes a flange portion 21a (hereinafter, also referred to as a tip side flange) that has the maximum diameter in the first plunger 21.

The second plunger 22 comes in contact with an electrode formed on the circuit board 200. The second plunger 22 has a flange portion 22a (hereinafter, also referred to as a wiring side flange) that has the maximum diameter in the second plunger 22. This second plunger 22 is movable in an axial direction by an expanding and contracting action of the spring member 23, is energized in the direction of the circuit board 200 by the elastic force of the spring member 23, and comes in contact with an electrode of the circuit board 200. In addition, in the present embodiment, the diameter of the flange portion 21a is the same as the diameter of the flange portion 22a.

The first plunger 21 side of the spring member 23 is a tightly winding portion 23a, while the second plunger 22 side is a roughly winding portion 23b. The end of the tightly winding portion 23a is pressed by the first plunger 21 and comes in contact with the flange portion 21a. On the other hand, the end of the roughly winding portion 23b is pressed by the second plunger 22 and comes in contact with the flange portion 22a. Moreover, the first plunger 21 and the second plunger 22 are joined to the spring member 23 by the winding force of the spring and/or soldering.

Figure 3:
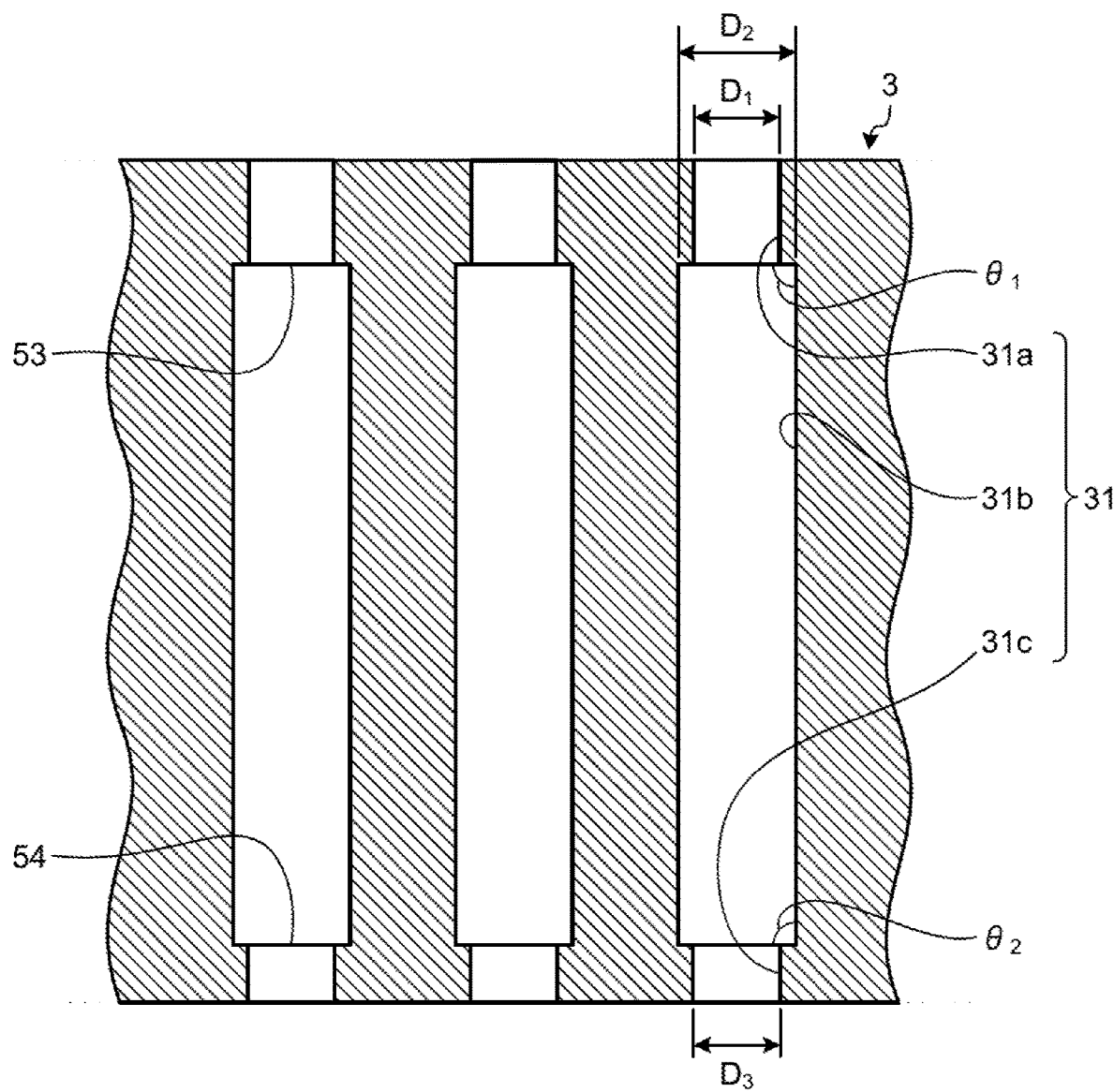
FIG. 3 is a sectional view illustrating a configuration of a main part of a probe holder equipped in the probe unit according to the embodiment of the present invention.

FIG. 3 is a sectional, view illustrating a configuration of a main part of a probe holder equipped in the probe unit according to the embodiment of the present invention. The probe holder 3 is formed of one plate formed by using resin, an insulating material such as machinable ceramic, or metal. When the probe holder 3 is formed using metal, on the surface of the probe holder 3, an insulating film may be formed, or an insulating material may be combined. The probe holder 3 is formed using a resin material having a bending elastic modulus of 0.5 GPa or more and 20 GPa or less, a machinable ceramic having a longitudinal elastic modulus of 60 GPa or more and 200 GPa or less, or a metal having a longitudinal elastic modulus of 70 GPa or more and 250 GPa or less.

In order to accommodate the probes 2, in the probe holder 3, holder holes 31 penetrating this probe holder 3 are formed. The respective formation positions of the holder holes 31 are decided correspondingly to the wiring pattern of the semiconductor integrated circuit 100.

The holder hole 31 is made in a stepped hole shape with diameters different along the penetrating direction. Namely, the holder hole 31 includes a first hole portion 31a (hereinafter, also referred to as a tip side small hole) having an opening on an upper end surface of the probe holder 3, a large diameter portion 31b with a diameter larger than this first hole portion 31a, and a second hole portion 31c (hereinafter, also referred to as a wiring side small hole) having an opening on a lower end surface of the probe holder 3. The shape of the holder hole 31 is decided in accordance with the configuration of the probe 2 to be accommodated. The flange portion 21a of the first plunger 21 comes in contact with a boundary wall 53 between the first hole portion 31a and the large diameter portion 31b, thereby having a slip-off preventing function for the probe 2 from the probe holder 3. Moreover, the flange portion 22a of the second plunger 22 comes in contact with a boundary wall 54 between the large diameter portion 31b and the second hole portion 31c, thereby having a slip-off preventing function for the probe 2 from the probe holder 3. In the stepped portion between the first hole portion 31a and the large diameter portion 31b, and in the stepped portion between the large diameter portion 31b and the second hole portion 31c, an angle (for example, angles $\theta_1$ and $\theta_2$ illustrated in FIG. 3) formed by a corner portion of the stepped portion is approximately 90 degrees, for example, 85 degrees or more and 95 degrees or less. In this connection, the stepped portion may be formed at an angle exceeding 95 degrees.

The diameter of the first hole portion 31a is smaller than the diameter of the large diameter portion 31b and is approximately equal to the diameter of the flange portion 21a of the probe 2. Moreover, the diameter of the second hole portion 31c is smaller than the diameter of the large diameter portion 31b and is approximately equal to the diameter of the flange portion 22a of the probe 2. In the present embodiment, the diameter of the first hole portion 31a and the diameter of the second hole portion 31c are the same. Moreover, the respective diameters of the flange portions 21a and 22a are also the same. The diameter of the first hole portion 31a and the diameter of the second hole portion 31c are each, for example, 200 μm or more and 800 μm or less.

Preferably, a distance $D_3$-$D_{12}$ (hereinafter, also referred to as a wiring side clearance) between the second hole portion 31c and the flange portion 22a satisfies −20≤$D_3$-$D_{12}$≤10 (μm) where $D_1$ is the diameter of the first hole portion 31a, $D_2$ is the diameter of the large diameter portion 31b, $D_3$ is the diameter of the second hole portion 31c, $D_{11}$ is the diameter of the flange portion 21a, and $D_{12}$ is the diameter of the flange portion 22a is preferable in a point of inserting the probe 2 in the holder hole 31 and holding the probe 2 without slipping it off from the holder hole 31. Moreover, the first hole portion 31a, the large diameter portion 31b, and the second hole portion 31c satisfy the relations of $D_1$=$D_3$ and 0.50≤$D_1$/$D_2$≤0.95 (0.50≤$D_3$/$D_2$≤0.95). If $D_1$/$D_2$ is less than 0.50, a boring process described later becomes difficult, and if $D_1$/$D_2$ exceeds 0.95, it becomes difficult to form a stepped portion between holes.

When producing the probe holder 3, first of all, the first hole portion 31a and the second hole portion 31c are formed using a processing member, such as a drill. Thereafter, by a boring process or the like, the large diameter portion 31b is formed.

When the probe holder 3 has been produced, the above-mentioned probe 2 is inserted from the second hole portion 31c side, whereby the above-mentioned probe unit 1 can be assembled. At this time, when the diameter of the flange portions 21a and 22a of the probe 2 is larger than the diameter of the hole portion on the insertion side, by inclining the first plunger 21 and the second plunger 22, or by making a hole portion deform elastically, the probe 2 is inserted into the probe holder 3.

Moreover, when the probe 2 is exchanged, a jig, such as a pin, is inserted from the first hole portion 31a, and then, by pushing out the probe 2 from the second hole portion 31c on the opposite side, the probe 2 is taken out and a new probe 2 is inserted, whereby the probe 2 can be exchanged.

Figure 4:
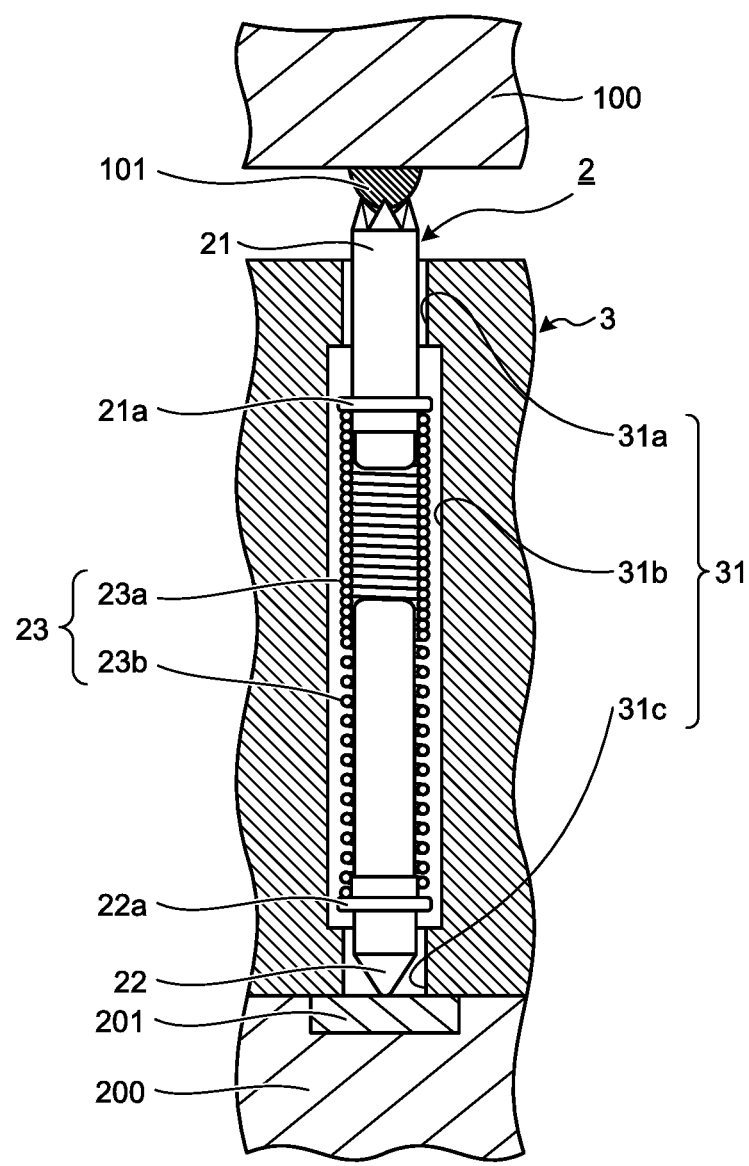
FIG. 4 is a partial sectional view illustrating a configuration of a main part of the probe unit at the time of inspecting a semiconductor integrated circuit.

FIG. 4 is a drawing illustrating a state at the time of inspecting the semiconductor integrated circuit 100 by using the probe holder 3. At the time of inspecting the semiconductor integrated circuit 100, by a contact load from the semiconductor integrated circuit 100, the spring member 23 becomes a state of having been compressed in the longitudinal direction. When the spring member 23 is compressed, as illustrated in FIG. 4, the tightly winding portion 23a comes in contact with a base end side of the second plunger 22. With this, reliable electrical conduction can be obtained. At this time, since the base end side of the second plunger 22 has entered up to a lower portion of the tightly winding portion 23a, the axis line of the second plunger 22 does not fluctuate greatly.

A test signal supplied from the circuit board 200 to the semiconductor integrated circuit 100 at the time of a test proceeds from an electrode 201 of the circuit board 200 through the second plunger 22, the tightly winding portion 23a, and the first plunger 21 of the probe 2 and arrives at a connection electrode 101 of the semiconductor integrated circuit 100. In this way, in the probe 2, since the first plunger 21 and the second plunger 22 are electrically conducted through the tightly winding portion 23a, the electrical conduction path of an electrical signal can be made minimum. Therefore, it is possible to prevent a signal from flowing into the roughly winding portion 23b at the time of a test and to intend to stabilize inductance.

According to the embodiment mentioned above, the probe holder 3 is formed of one plate, and the probe 2 is inserted into or removed from the probe holder 3 that includes a hole portion (the first hole portion 31a and the second hole portion 31c) capable of holding the probe 2, whereby it is made possible to assemble the probe unit 1 and exchange the probe 2. In the conventional technique, after the probe 2 has been accommodated in one plate, the other plate is covered. Moreover, the probe 2 is exchanged by disassembling the two plates. However, with the above-described configuration, without performing the above-described operations in the conventional technique, it is possible to arrange and dispose the probe 2 at a predetermined position of the probe holder certainly and easily.

In this connection, in the above-mentioned embodiment, a description has been made on the assumption that the diameter of the first hole portion 31a and the diameter of the second hole portion 31c are the same. However, the diameter of the first hole portion 31a and the diameter of the second hole portion 31c may be different from each other. In concreter terms, the diameter of the first hole portion 31a may be smaller than the diameter of the second hole portion 31c. At this time, the diameter $D_1$ of the first hole portion 31a, the diameter $D_2$ of the large diameter portion 31b, and the diameter $D_3$ of the second hole portion 31c satisfy the relation of, for example, $D_1$/$D_3$≤1, 0.50≤$D_1$/$D_2$≤0.95, and 0.5≤$D_3$/$D_2$≤0.95. Moreover, in this case, the diameter of the flange portion 21a is smaller than the diameter of the flange portion 22a.

In this connection, in the flange portions 21a and 22a of the probe 2, an end portion in the radial direction may be made a taper shape. The material on an inner circumference side and the material on an outer circumference side may be made different, and only an outer circumference side of a flange portion may be provided with elasticity.

Moreover, in the above-mentioned embodiment, a description has been made on the assumption that there are provided two plungers and a spring member that connects these plungers. However, without being limited to this, for example, it is applicable to one that can expand or contract along the longitudinal direction of the contact probe, such as a pipe probe having a flange.

EXAMPLES

Hereinafter, examples of a probe holder according to the present invention will be described. In this connection, the present invention is not limited to these examples. First, the contents of tests according to the present examples are explained.

In the present examples, with regard to the probe holder 3, a state at the time of inserting the probe 2 and a holding state of the inserted probe 2 were evaluated as follows.

(Probe Insertion)

Good: it is possible to insert the probe 2 into the probe holder 3.

Poor: It is not possible to insert the probe 2 into the probe holder 3.

(Probe Holding)

Good: it is possible to hold the probe 2 in the probe holder 3.

Poor: it is not possible to hold the probe 2 in the probe holder 3.

Successively, a configuration of the probe 2 and the probe holder 3 according to the present examples will be described.

First Example

In the probe 2, the diameter of the tip side flange 21a was made 640 μm and the diameter of the wiring side flange 22a was made 650 μm. The probe holder 3 was produced by using PEEK being a super engineering plastic having a bending elastic modulus of 8 GPa. In the probe holder 3, the diameter of the tip side small hole 31a was made 600 μm, the diameter of the large diameter portion 31b (large hole) was made 710 μm, and the diameter of the wiring side small hole 31c was made 620 μm. The wiring side clearance was −30 μm. Dimensions and evaluation results are illustrated in Table 1.

TABLE 1

|  |  | First example | Second example | Third example | Fourth example | Fifth example | Sixth example |
| --- | --- | --- | --- | --- | --- | --- | --- |
| Small hole | Tip side |  |  | 600 |  |  |  |
|  | Wiring side | 620 | 630 | 640 | 650 | 660 | 670 |
|  | Large hole |  |  | 710 |  |  |  |
| Probe flange | Tip side |  |  | 640 |  |  |  |
|  | Wiring side |  |  | 650 |  |  |  |
| Evaluation result | Probe insertion | Poor | Good | Good | Good | Good | Good |
|  | Probe holding | — | Good | Good | Good | Good | Poor |
| Wiring side clearance |  | −30 | −20 | −10 | 0 | 10 | 20 |

In the first example, it was confirmed that it is impossible to insert the probe 2 into the probe holder 3.

Second Example

As the probe the similar one to that in the first example was used. The probe holder 3 was the same as that in the first example except that the diameter of the wiring side small hole 31c was made 630 μm. The wiring side clearance was −20 μm.

In the second example, it was confirmed that it is possible to insert the probe 2 into the probe holder 3 and it is possible to hold the probe 2 after the insertion.

Third Example

As the probe 2, the similar one to that in the first example was used. The probe holder 3 was the same as that in the first example except that the diameter of the wiring side small hole 31c was made 640 μm. The wiring side clearance was −10 μm.

In the third example, it was confirmed that it is possible to insert the probe 2 into the probe holder 3 and it is possible to hold the probe 2 after the insertion.

Fourth Example

As the probe 2, the similar one to that in the first example was used. The probe holder 3 was the same as that in the first example except that the diameter of the wiring side small hole 31c was made 650 μm. The wiring side clearance was 0 μm.

In the fourth example, it was confirmed that at is possible to insert the probe 2 into the probe holder 3 and it is possible to hold the probe 2 after the insertion.

Fifth Example

As the probe 2, the similar one to that in the first example was used. The probe holder 3 was the same as that in the first example except that the diameter of the wiring side small hole 31c was made 660 μm. The wiring side clearance was 10 μm.

In the fifth example, it was confirmed that it is possible to insert the probe 2 into the probe holder 3 and it is possible to hold the probe 2 after the insertion.

Sixth Example

As the probe 2, the similar one to that in the first example was used. The probe holder 3 was the same as that in the first example except that the diameter of the wiring side small hole 31c was made 670 μm. The wiring side clearance was 20 μm.

In the sixth example, it was confirmed that it is possible to insert the probe 2 into the probe holder 3; however, it is not possible to hold the probe 2, because, after the insertion, the probe 2 fell by its own weight.

Seventh Example

In the probe 2, the diameter of the tip side flange 21a was made 310 μm and the diameter of the wiring side flange 22a was made 360 μm. The probe holder 3 was produced by using PEEK being a super engineering plastic having a bending elastic modulus of 8 GPa. In the probe holder 3, the diameter of the tip side small hole 31a was made 310 μm, the diameter of the large diameter portion 31b (large hole) was made 400 μm, and the diameter of the wiring side small hole 31c was made 330 µm. The wiring side clearance was −30 µm. Dimensions and evaluation results are illustrated in Table 2.

TABLE 2

| | | Seventh example | Eighth example | Ninth example | Tenth example | Eleventh example | Twelfth example |
|---|---|---|---|---|---|---|---|
| Small hole | Tip side | | | | 310 | | |
| | Wiring side | 330 | 340 | 350 | 360 | 370 | 380 |
| | Large hole | | | | 400 | | |
| Probe flange | Tip side | | | | 350 | | |
| | Wiring side | | | | 360 | | |
| Evaluation result | Probe insertion | Poor | Good | Good | Good | Good | Good |
| | Probe holding | — | Good | Good | Good | Good | Poor |
| | Wiring side clearance | −30 | −20 | −10 | 0 | 10 | 20 |

In the seventh example, it was confirmed that it is impossible to insert the probe 2 into the probe holder 3.

Eighth Example

As the probe 2, the similar one to that in the seventh example was used. The probe holder 3 was the same as that in the seventh example except that the diameter of the wiring side small hole 31c was made 340 µm. The wiring side clearance was −20 µm.

In the eighth example, it was confirmed that it is possible to insert the probe 2 into the probe holder 3 and it is possible to hold the probe 2 after the insertion.

Ninth Example

As the probe 2, the similar one to that in the seventh example was used. The probe holder 3 was the same as that in the seventh example except that the diameter of the wiring side small hole 31c was made 350 µm. The wiring side clearance was −10 µm.

In the ninth example, it was confirmed that it is possible to insert the probe 2 into the probe holder 3 and it is possible to hold the probe 2 after the insertion.

Tenth Example

As the probe 2, the similar one to that in the seventh example was used. The probe holder 3 was the same as that in the seventh example except that the diameter of the wiring side small hole 31c was made 360 µm. The wiring side clearance was 0 µm.

In the tenth example, it was confirmed that it is possible to insert the probe 2 into the probe holder 3 and it is possible to hold the probe 2 after the insertion.

Eleventh Example

As the probe 2, the similar one to that in the seventh example was used. The probe holder 3 was the same as that in the seventh example except that the diameter of the wiring side small hole 31c was made 370 µm. The wiring side clearance was 10 µm.

In the eleventh example, it was confirmed that it is possible to insert the probe 2 into the probe holder 3 and it is possible to hold the probe 2 after the insertion.

Twelfth Example

As the probe 2, the similar one to that in the seventh example was used. The probe holder 3 was the same as that in the seventh example except that the diameter of the wiring side small hole 31c was made 380 µm. The wiring side clearance was 20 µm.

In the twelfth example, it was confirmed that it is possible to insert the probe 2 into the probe holder 3; however, it is not possible to hold the probe 2, because, after the insertion, the probe 2 fell by its own weight.

In this connection, also in PES (polyether sulfone) being a super engineering plastic having a bending elastic modulus of 2.6 GPa to 8.4 GPa, PEEK (polyetheretherketone) being a super engineering plastic having a bending elastic modulus of 4.0 GPa to 17.0 GPa, and PI (polyimide) being a super engineering plastic having a bending elastic modulus of 2.4 GPa to 5.8 GPa, the same results are obtained.

In this way, the present invention may include various embodiments and the like not described herein, and it is possible to apply various design changes etc. within a range not deviating from the technical concept specified by the scope of the appended claims.

As described in the above, the probe holder and probe unit according to the present invention are suitable for arranging and disposing a contact probe at a predetermined position of the probe holder certainly and easily.

REFERENCE SIGNS LIST 1 probe unit
2 contact probe (probe)
3 probe holder
21 first plunger
21a, 22a flange portion
22 second plunger
23 spring member
23a tightly winding portion
23b roughly winding portion
31 holder hole
31a first hole portion
31b large diameter portion
31c second hole portion
100 semiconductor integrated circuit
101 connection electrode
200 circuit board

The invention claimed is:

1. A probe holder for holding contact probes each of which comes in contact with one electrode of a contact target on one end portion side in a longitudinal direction, the probe holder comprising
 a plate in which holder holes configured to hold the respective contact probes are formed and penetrate the probe holder, wherein
 each of the holder holes includes
  a first hole portion disposed on one end of a penetrating direction and extending in the penetrating direction, a large diameter portion connected to the first hole portion and extending in the penetrating direction, the large diameter portion being larger than a diameter of the first hole portion, and a second hole portion disposed on another end of the penetrating direction, connected to the large diameter portion, and extending in the penetrating direction, the second hole portion being smaller than a diameter of the large diameter portion, wherein the probe holder is made of an insulating material having a bending elastic modulus of 0.5 GPa or more and 20 GPa or less.

2. The probe holder according to claim 1, wherein $D_1=D_3$ and $0.50 \leq D_1/D_2 \leq 0.95$ are satisfied where $D_1$ is a diameter of the first hole portion, $D_2$ is a diameter of the large diameter portion, and $D_3$ is a diameter of the second hole portion.

3. The probe holder according to claim 1, wherein $D_1/D_3<1$, $0.50 \leq D_1/D_2 \leq 0.95$, and $0.5 \leq D_3/D_2 \leq 0.95$ are satisfied where $D_1$ is a diameter of the first hole portion, $D_2$ is a diameter of the large diameter portion, and $D_3$ is a diameter of the second hole portion.

4. A probe unit comprising:

contact probes each of which comes in contact with one electrode of a contact target on one end portion side in a longitudinal direction; and a probe holder including a plate in which holder holes configured to hold the respective contact probes are formed, wherein each of the holder holes includes a first hole portion disposed on one end of a penetrating direction and extending in the penetrating direction, a large diameter portion connected to the first hole portion and extending in the penetrating direction, the large diameter portion being larger than a diameter of the first hole portion, and a second hole portion connected to the large diameter portion and extending in the penetrating direction, the second hole portion being smaller than a diameter of the large diameter portion, wherein the probe holder is made of an insulating material having a bending elastic modulus of 0.5 GPa or more and 20 GPa or less.

5. The probe unit according to claim 4, wherein each of the contact probe includes:

a first plunger including a first flange portion;

a second plunger including a second flange portion; and a spring member configured to connect with the first plunger at one end and connect with the second plunger at another end.

6. The probe unit according to claim 5, wherein a relation of $-20 \leq D_3 - D_{12} \leq 10$ (μm) is satisfied where $D_3$ is a diameter of the second hole portion and $D_{12}$ is a diameter of the second flange portion.

7. The probe unit according to claim 5, wherein a diameter of the first hole portion and a diameter of the second hole portion are the same, and a diameter of the first flange portion and a diameter of the second flange portion are the same.

8. The probe unit according to claim 5, wherein a diameter of the first hole portion is smaller than a diameter of the second hole portion and a diameter of the first flange portion is smaller than a diameter of the second flange portion.

* * * * *